(12) United States Patent
Ichimura et al.

(10) Patent No.: US 8,779,369 B2
(45) Date of Patent: Jul. 15, 2014

(54) RADIATION DETECTION APPARATUS, SCINTILLATOR PANEL, METHOD FOR MANUFACTURING SAME AND RADIATION DETECTION SYSTEM

(75) Inventors: Tomoaki Ichimura, Kitamoto (JP); Satoshi Okada, Tokyo (JP); Kazumi Nagano, Fujisawa (JP); Keiichi Nomura, Honjo (JP); Yohei Ishida, Honjo (JP); Yoshito Sasaki, Honjo (JP); Akiya Nakayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 210 days.

(21) Appl. No.: 13/366,066

(22) Filed: Feb. 3, 2012

(65) Prior Publication Data

US 2012/0223240 A1    Sep. 6, 2012

(30) Foreign Application Priority Data

Mar. 1, 2011    (JP) ................................. 2011-044298

(51) Int. Cl.
  *G01T 1/20*    (2006.01)
  *G21K 4/00*    (2006.01)
(52) U.S. Cl.
  CPC ....................................... *G21K 4/00* (2013.01)
  USPC ....................................................... 250/369
(58) Field of Classification Search
  CPC ........ G01T 1/202; G01T 1/2018; G21K 4/00; G21K 2004/12
  USPC ............................................ 250/369, 361 R
  See application file for complete search history.

(56) References Cited

U.S. PATENT DOCUMENTS

| | | | | |
|---|---|---|---|---|
| 6,262,422 | B1 * | 7/2001 | Homme et al. | 250/370.11 |
| 6,847,041 | B2 | 1/2005 | Okada et al. | |
| 7,244,945 | B2 | 7/2007 | Okada et al. | |
| RE40,291 | E * | 5/2008 | Homme et al. | 250/370.11 |
| 7,408,177 | B2 * | 8/2008 | Homme et al. | 250/483.1 |
| 7,514,686 | B2 * | 4/2009 | Ogawa et al. | 250/361 R |
| 7,705,315 | B2 * | 4/2010 | Homme et al. | 250/368 |
| 7,910,892 | B2 * | 3/2011 | Horiuchi et al. | 250/370.11 |
| 2007/0272867 | A1 * | 11/2007 | Tahon et al. | 250/361 R |
| 2010/0028557 | A1 * | 2/2010 | Nagano | 427/535 |

FOREIGN PATENT DOCUMENTS

| | | |
|---|---|---|
| JP | 2003-66196 A | 3/2003 |
| JP | 2006-78471 A | 1/2011 |

OTHER PUBLICATIONS

U.S. Appl. No. 13/285,619, filed Oct. 31, 2011.
U.S. Appl. No. 13/349,041, filed Jan. 12, 2012.

* cited by examiner

*Primary Examiner* — Kiho Kim
(74) *Attorney, Agent, or Firm* — Fitzpatrick, Cella, Harper & Scinto

(57) ABSTRACT

A radiation detection apparatus comprising a sensor panel and a scintillator panel is provided. The scintillator panel including a substrate, a scintillator disposed on the substrate, and a scintillator protective film that has a first organic protective layer and an inorganic protective layer, and covers the scintillator. The scintillator protective film is located between the sensor panel and the scintillator. The first organic protective layer is located on a scintillator side from the inorganic protective layer. A surface on a sensor panel side of the scintillator is partially in contact with the inorganic protective layer.

18 Claims, 9 Drawing Sheets

RADIATION DETECTION APPARATUS, SCINTILLATOR PANEL, METHOD FOR MANUFACTURING SAME AND RADIATION DETECTION SYSTEM

BACKGROUND OF THE INVENTION

1. Field of the Invention

The present invention relates to a radiation detection apparatus, a scintillator panel, a method for manufacturing the same, and a radiation detection system.

2. Description of the Related Art

In recent years, digital radiation detection apparatuses have been put to practical use in which a scintillator that converts X-rays and emits light with a wavelength that a photoelectric conversion element can detect is stacked on a sensor panel having such a photoelectric conversion element. Since scintillators have a high deliquescence, in Japanese Patent Laid-Open No. 2006-78471, the scintillator is covered with hot melt resin, and thereby the moisture-resistance of the scintillator is enhanced. In addition, methods in which a scintillator panel having a scintillator, and a sensor panel having a photoelectric conversion element are separately prepared and laminated together to manufacture a radiation detection apparatus have become more popular. In this manner, when the radiation detection apparatus is manufactured, the shorter the distance between the scintillator and the sensor panel is, the higher the sharpness of the radiation detection apparatus is. In Japanese Patent Laid-Open No. 2003-66196, after a surface of a scintillator is planarized, the scintillator is covered with a protective film, and thereby the thickness of the protective film is reduced.

SUMMARY OF THE INVENTION

As described above, in the radiation detection apparatus in which the scintillator panel and the sensor panel are laminated, it is desirable to enhance the moisture-resistance of the scintillator, and in addition, reduce the distance between the scintillator panel and the sensor panel. Therefore, the present invention provides a technique for enhancing the moisture-resistance of a scintillator, and in addition, reducing the distance between the scintillator and a sensor panel, in a radiation detection apparatus.

A first aspect of the present invention provides a radiation detection apparatus comprising a sensor panel and a scintillator panel, the scintillator panel including: a substrate; a scintillator disposed on the substrate; and a scintillator protective film that has a first organic protective layer and an inorganic protective layer, and covers the scintillator, wherein the scintillator protective film is located between the sensor panel and the scintillator, the first organic protective layer is located on a scintillator side from the inorganic protective layer, and a surface on a sensor panel side of the scintillator is partially in contact with the inorganic protective layer.

A second aspect of the present invention provides a scintillator panel comprising a substrate; a scintillator disposed on the substrate; and a scintillator protective film that has an organic protective layer and an inorganic protective layer, and covers the scintillator, wherein the organic protective layer is located on a scintillator side from the inorganic protective layer, and a surface on an opposite side to a surface on a substrate side, of the scintillator is partially in contact with the inorganic protective layer.

A third aspect of the present invention provides a method for manufacturing a radiation detection apparatus, comprising: forming a scintillator on a substrate; preparing a scintillator protective film having an organic protective layer and an inorganic protective layer; covering the scintillator with the scintillator protective film so that the organic protective layer is in contact with the scintillator; bonding, by thermocompression bonding, the scintillator protective film to the scintillator; and laminating the scintillator covered with the scintillator protective film and a sensor panel, wherein in the laminating, a surface on an opposite side to a surface on a substrate side, of the scintillator that enters partially the organic protective layer reaches the inorganic protective layer and stops.

A fourth aspect of the present invention provides a method for manufacturing a scintillator panel comprising: forming a scintillator on a substrate; preparing a scintillator protective film having an organic protective layer and an inorganic protective layer; covering the scintillator with the scintillator protective film so that the organic protective layer is in contact with the scintillator; and bonding, by thermocompression bonding, the scintillator protective film to the scintillator, wherein in the bonding by thermocompression bonding, a surface on a side opposite to a surface on a substrate side, of the scintillator that enters partially the organic protective layer reaches the inorganic protective layer and stops.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1A:
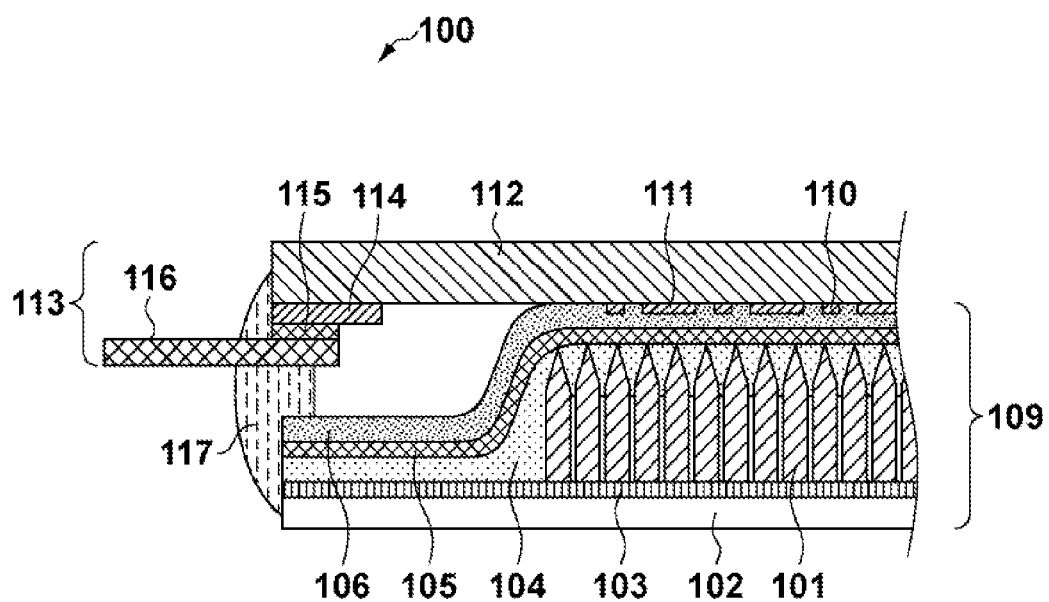
FIGS. 1A and 1B are diagrams illustrating an illustrative structure of a radiation detection apparatus of an embodiment of the present invention.
Figure 1B:
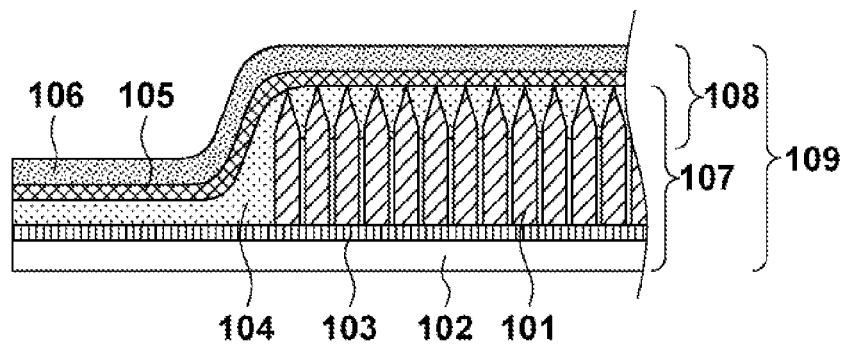

Embodiments of the present invention will now be described in detail with reference to accompanying drawings. First, an illustrative structure of a radiation detection apparatus 100 according to one embodiment of the present invention will be described with reference to FIGS. 1A and 1B. FIG. 1A shows a schematic cross-sectional view of a part of the radiation detection apparatus 100. FIG. 1B is a schematic cross-sectional view focusing on a scintillator panel 109 of the radiation detection apparatus 100.

The radiation detection apparatus 100 may include a sensor panel 113 and the scintillator panel 109. The sensor panel 113 may include an insulating substrate 112 made of glass or the like, and a pixel array formed on the insulating substrate 112. The pixel array may be formed by semiconductor members 110 such as photoelectric conversion elements or TFTs, and electrically conductive members 111 connected to the semiconductor members 110. Pixels including the semiconductor members 110 may be arranged in a matrix form in the pixel array, and the semiconductor member 110 of each pixel may be connected to the corresponding electrically conductive member 111.

The photoelectric conversion element may convert, into an electric charge, the light converted from radiation by the scintillator panel 109. The photoelectric conversion element may be formed by using a material such as amorphous silicon or polysilicon, for example. The photoelectric conversion element may be a MIS sensor, a PIN sensor, a TFT sensor, or the like, for example. In addition, the photoelectric conversion element may be a CCD sensor, or a CMOS sensor that can be formed on a single crystal silicon substrate.

The electrically conductive member 111 may include a signal line for reading out, via a TFT, the charge photoelectrically converted by the photoelectric conversion element, a bias line for applying a voltage Vs to the photoelectric conversion element, and a drive line for driving the TFT. The charge photoelectrically converted by the photoelectric conversion element may be read out by the TFT, and may be output to an external signal processing circuit (not shown) via the electrically conductive member 111 and a peripheral circuit (not shown). In addition, the gates of the TFTs arrayed in the row direction are connected to the drive line for each row, and the TFTs can be selected for each row by the TFT drive circuit (not shown).

The scintillator panel 109 may include a scintillator substrate 107 and a scintillator protective film 108. The scintillator substrate 107 may include a scintillator supporting substrate 102, and a scintillator 101 disposed above the scintillator supporting substrate 102.

The scintillator 101 may include a set of columnar crystals that may be formed by using a material having an alkali halide as a principal component. The columnar crystals extend from the scintillator supporting substrate 102, and the tips of the columnar crystals that form the surface on the side (sensor panel side) opposite to the surface on the scintillator supporting substrate side may have a tapered shape. By having a tapered shape, the columnar crystals of the scintillator 101 can be easily entered into the scintillator protective film 108. If the scintillator 101 has such a set of columnar crystals, the scintillator 101 has a light guide property, and it is possible to obtain a good scintillator property. CsI:Tl, CsI:Na, CsBr:Tl, NaI:Tl, LiI:Eu, KI:Tl, or the like, for example, can be used as material having an alkali halide as the principal component.

The scintillator supporting substrate 102 supports the scintillator 101. The scintillator supporting substrate 102 may be formed by a material that is not deformed at the temperature during the vacuum vapor-deposition for forming the scintillator 101. The scintillator supporting substrate 102 may reflect the light traveling to the side opposite to the sensor panel 113, of the light converted and emitted by the scintillator 101, functioning as a reflection layer for guiding it to the sensor panel 113. By functioning as a reflection layer, the light utilization efficiency of the radiation detection apparatus 100 can be enhanced. The reflection layer also has the function of blocking light from outside of the radiation detection apparatus 100, and preventing the generation of noise due to external light in the radiation detection apparatus 100. To let the scintillator supporting substrate 102 function as a reflection layer, a metal plate with a high heat resistance and a high surface reflectivity may be used as the scintillator supporting substrate 102. If the amount of the absorption of radiation of the scintillator supporting substrate 102 is large, then there is the risk that the dose to which a person to be imaged is exposed increases. Therefore, when a metal plate is used as the scintillator supporting substrate 102, for example aluminum, which has little X-ray absorption, may be used.

Figure 2:
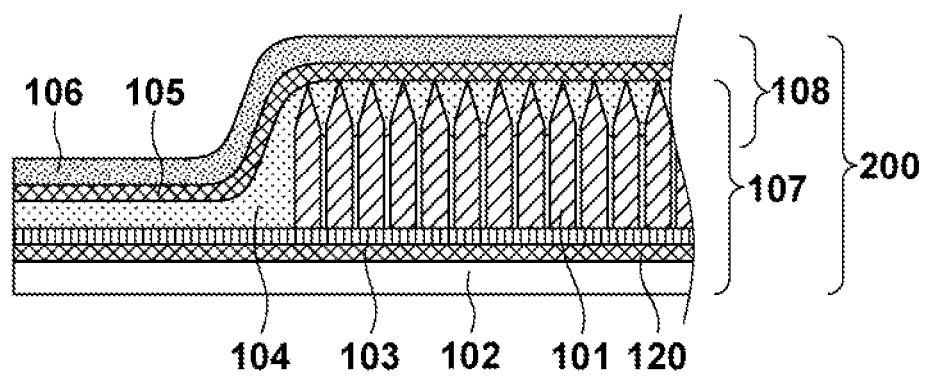
FIG. 2 is a diagram illustrating another illustrative structure of a radiation detection apparatus of an embodiment of the present invention.

If the scintillator supporting substrate 102 is not supposed to function as a reflection layer, then a substrate of carbon based resin, PPS resin type, or the like that has a high heat resistance and little X-ray absorption may be used as the scintillator supporting substrate 102. In this case, as in a scintillator panel 200 as shown in FIG. 2, a reflection layer 120 such as a metal foil or metal film may be separately disposed on the scintillator supporting substrate 102. FIG. 2 is a diagram illustrating a modified example of the scintillator panel 109 shown in FIG. 1B. The common components in both figures are marked with identical reference numerals, and duplicate description is omitted. Metal material such as aluminum, gold, or silver may be used as the reflection layer 120 of the scintillator panel 200, and particularly, aluminum or gold with a high reflectivity may be used.

The scintillator supporting substrate 102 may include, on the surface thereof on the scintillator 101 side, a supporting substrate protective layer 103. In this case, the scintillator supporting substrate 102 and the supporting substrate protective layer 103 are integrated to support the scintillator 101. By including the supporting substrate protective layer 103, the corrosion of the scintillator supporting substrate 102 due to the contact with the scintillator 101 can be reduced, and the adhesion of the scintillator 101 relative to the scintillator supporting substrate 102 can be enhanced. In addition, by including the supporting substrate protective layer 103, the reflection from the scintillator supporting substrate 102 to the scintillator 101 can be adjusted. The supporting substrate protective layer 103 may be formed by a material that absorbs a little of the light reflected from the scintillator supporting substrate 102. If the supporting substrate protective layer 103 is formed by organic material, then polyimide based resin, acrylic based resin, or silicone based resin, which have a high heat resistance and also a high light transmittance, may be used as the organic material. If the supporting substrate protective layer 103 is formed by inorganic material, then an oxide such as $Al_2O_3$, $SiO_2$, or $TiO_2$, or nitride such as SiN, which have a high heat resistance and also a high light transmittance, can be used as the inorganic material.

If the material for the scintillator 101 is an alkali halide based material, then the scintillator 101 has deliquescent. Therefore, a part or all of the scintillator 101 may be covered with the scintillator protective film 108, and thereby a scintillator panel 109 with a high durability can be manufactured. In the example of FIGS. 1A and 1B, the faces of the scintillator 101 that do not contact the supporting substrate protective layer 103, i.e., the side face and the top face of the scintillator 101 are covered with the scintillator protective film 108. The scintillator protective film 108 further covers the part of the supporting substrate protective layer 103 that is not covered with the scintillator 101.

The scintillator protective film 108 has a three-layer structure of an organic protective layer 104, an inorganic protective layer 105, and an organic protective layer 106. In the following description, a first organic protective layer located closer to the scintillator 101 side (scintillator side) than the inorganic protective layer 105 is denoted as the organic protective layer 104. In addition, a second organic protective layer located closer to the sensor panel 113 side (sensor panel side) than the inorganic protective layer 105 is denoted as the organic protective layer 106. The scintillator protective film 108 includes the inorganic protective layer 105, and thereby the scintillator 101 that enters the organic protective layer 104 reaches the inorganic protective layer 105 and stops. That is, the inorganic protective layer 105 may have an alignment function during thermocompression bonding. As a result, the scintillator 101 penetrates partially the organic protective layer 104 to come into contact with the inorganic protective layer 105. Specifically, the tips of the columnar crystal forming the scintillator 101 on the side opposite to the scintillator supporting substrate 102 penetrate the organic protective layer 104 to come into contact with the inorganic protective layer 105.

The scintillator protective film 108 according to the present embodiment may have the function of preventing the intrusion of moisture from outside air into the scintillator 101. The scintillator protective film 108 may also have a function of protecting the semiconductor members 110 and the electrically conductive members 111 from the corrosion and damage from the scintillator 101. The scintillator protective film 108 may also have a function of bonding the sensor panel 113 and the scintillator panel 109. In addition, the scintillator panel 108 can transmit the light from the scintillator 101 to the pixel array.

The scintillator protective film 108 is located between the scintillator 101 and the sensor panel 113. When the thickness of the scintillator protective film 108 is less than 10 µm, the unevenness and splash defects of the surface of the scintillator 101 cannot be completely covered, which may lead to a reduction of the moisture proofing function, and breaking of the sensor panel 113. On the other hand, when the thickness of the scintillator protective film 108 is more than 100 µm, the light generated in the scintillator 101 and the light reflected from the reflection layer tends to scatter within the scintillator protective film 108. As a result, there is the risk that the sharpness and MTF (Modulation Transfer Function) of the image obtained in the radiation detection apparatus 100 are degraded. Therefore, the scintillator protective film 108 may be formed so that the thickness of the part covering the upper part of the scintillator 101, of the scintillator protective film 108 is not less than 10 µm and not more than 100 µm.

$SiO_2$, $Al_2O_3$, $TiO_2$, ITO, ZnO, SiN or the like, which have a high hardness, may be used as the inorganic material for the inorganic protective layer 105. A hot melt resin of the polyimide type, epoxy type, polyolefin type, polyester type, polyurethane type, or polyamide type that can be formed by thermocompression bonding, or the like, for example, may be used as the organic material for the organic protective layer 104 and the organic protective layer 106. Also, of these, a resin with particularly low moisture permeability may be used. As the organic material, a single resin materials, or a mixture of two or more thereof may be used. The organic material used in the organic protective layer 104 and the organic material used in the organic protective layer 106 may be the same or different. In order to adjust the amount by which the organic material enters the gaps between the columnar crystals of the scintillator 101 and the amount by which the organic material enters the surface of the sensor panel 113, organic materials with different thermocompression bonding temperature, thermocompression bonding pressure, or viscosity may be used for the respective protective layers. Particularly, when the heat resistance of the sensor panel 113 is a problem, a cohesive agent having cohesiveness at room temperature (for example, not less than 5° C. and not more than 35° C.) may be used as the organic protective layer 106.

Since the organic protective layer 104 contacts the scintillator 101, when the organic protective layer 104 contains a polar solvent, a solvent, or water, there is the risk that the scintillator 101 deliquesces, and the performance of the scintillator 101 is degraded. Therefore, a material that does not contain a polar solvent, a solvent, or water may be used as the organic protective layer 104. In addition, since the organic protective layer 106 contacts the semiconductor members 110 and the electrically conductive members 111, if the organic protective layer 106 has electrical conductivity, there is the risk that the operation of sensor panel 113 is compromised. Therefore, a material that does not contain electrical conductivity may be used as the organic protective layer 106.

Hot melt resins have the property that when their resin temperature increases, they melt and soften, and when their resin temperature decreases, they solidify. Hot melt resins are adhesive to other organic materials or inorganic materials in their softened state. At room temperature, hot melt resins become solid, and do not have adhesiveness. In addition, since hot melt resins do not contain a polar solvent, a solvent, or water, even if a hot melt resin contacts the scintillator 101, the hot melt resin does not dissolve the scintillator 101. Therefore, a hot melt resin may be used as the organic protective layer 104. In addition, since hot melt resins do not corrode or dissolve metal such as aluminum, or metalloid substances such as silicone, and do not have electrical conductivity, a hot melt resin may be used as the material for the organic protective layer 106. Hot melt resins are different from solvent volatile curable adhesive-resins formed in a solvent coating method by dissolving thermoplastic resin in solvent. Hot melt resins are classified by the base polymers (base materials) that are their principal components. Polyimides, epoxies, polyolefins, polyesters, polyurethanes, polyamides, or the like may be used as base polymers. It is important that the scintillator protective film 108 has superior moisture-proof characteristics so that the scintillator protective film 108 protects the scintillator 101. Therefore, a polyolefin based resin, polyester based resin, or polyimide based resin with superior moisture-proof characteristics may be used for the scintillator protective film 108. Furthermore, a polyolefin based resin, or polyimide based resin with a particularly low moisture absorptivity and high light transmittance may be used for the scintillator protective film 108.

The polyolefin based resin may contain, as its principal component, at least one of an ethylene-vinyl acetate copolymer, an ethylene-acrylic acid copolymer, an ethylene-acrylic ester copolymer, an ethylene-methacrylic acid copolymer, an ethylene-methacrylic ester copolymer, and an ionomer resin. Hirodine 7544 (manufactured by Hirodine Kogyo Co., Ltd.) may be used as a hot melt resin having an ethylene-vinyl acetate copolymer as its principal component. O-4121 (manufactured by Kurabo Industries, Ltd.) may be used as a hot melt resin having an ethylene-acrylic ester copolymer as its principal component. W-4210 (manufactured by Kurabo Industries, Ltd.) may be used as a hot melt resin having an ethylene-methacrylic ester copolymer as its principal component. H-2500 (manufactured by Kurabo Industries, Ltd.) may be used as a hot melt resin having an ethylene-acrylic ester copolymer as its principal component. P-2200 (manufactured by Kurabo Industries, Ltd.) may be used as a hot melt resin having an ethylene-acrylic acid copolymer as its principal component. Z-2 (manufactured by Kurabo Industries, Ltd.) may be used as a hot melt resin having an ethylene-acrylic ester copolymer as its principal component. M-5 (manufactured by Kurabo Industries, Ltd.) may be used as a hot melt resin having an ethylene-acrylic ester copolymer as its principal component. In addition, LNA-1007 (manufactured by Toray Industries, Inc.), LNA-20 (manufactured by Toray Industries, Inc.), or the like, which are hot melt resins having a polyimide-epoxy resin copolymer as their principal component, may be used as a polyimide based resin. As described in the embodiments below, in any region of the scintillator protective film 108, heat sealing (thermocompression bonding) by hot pressing process may be performed on a surface of the scintillator protective film 108 surrounding the region in which the scintillator 101 is formed. For such a purpose, hot melt resin of, for example, the polyolefin type, polyester type, or polyamide type, which has the property that, when its temperature increases, it melts and adheres to an adherend, and solidifies when its resin temperature decreases, may be used as the scintillator protective film 108. As for the condition of the heat sealing, by heating the hot melt resin for a few seconds to a few minutes at a temperature about 10 to 60° C. higher than the melting onset temperature of the hot melt resin, it is possible to melt the hot melt resin and to pressurize it in the range of 1 to 50 Kg/cm$^2$.

The radiation detection apparatus 100 may further include a connecting lead 114, a connecting section 115, and an external wiring line 116. The connecting lead 114 may be a bonding pad or the like electrically coupled to the pixel array. The external wiring line 116 may be a flexible wiring board or the like for connecting an external circuit or the like to the radiation detection apparatus 100. The connecting section 115 may be a solder, an anisotropic conductive film (ACF), or the like for electrically connecting the connecting lead 114 and the external wiring line 116.

The radiation detection apparatus 100 may further include a sealing member 117 for sealing a bonding part of a sensor panel 113 and the scintillator panel 109. The sealing member 117 may further have a function of preventing external light from entering the pixel array from between a sensor panel 113 and the scintillator panel 109. The sealing member 117 further may seal a bonding part of the supporting substrate protective layer 103, the organic protective layer 104, the inorganic protective layer 105, and the organic protective layer 106. In this case, the sealing member 117 may have the moisture proofing function of preventing the intrusion of moisture into the scintillator 101. Although it is possible to use epoxy based resin, silicone based resin, acrylic based resin, or the like, which are materials with superior moisture-proof characteristics and a low moisture permeability, as the material for the sealing member 117, it is also possible to use a polyester based, polyolefin based, polyamide based, or polyimide based resin for the sealing member 117. In addition, the sealing member 117 may have a transmittance of not more than 10% in order to block the light from outside of the radiation detection apparatus 100.

Figure 3A:
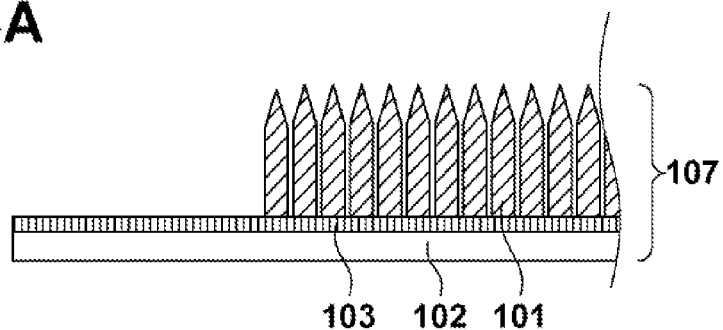
FIGS. 3A through 3C are diagrams illustrating an illustrative method for manufacturing a radiation detection apparatus of an embodiment of the present invention.

Next, with reference to FIGS. 3A through 3C, an illustrative method for manufacturing the radiation detection apparatus 100 will be described. First, as shown in FIG. 3A, the scintillator 101 having the set of columnar crystals is formed by vacuum deposition on a scintillator supporting substrate 102 on which a supporting substrate protective layer 103 is formed, and thereby the scintillator substrate 107 is formed. The scintillator 101, which has CsI:Tl, for example, is formed by vapor-co-depositing CsI (cesium iodide) and TlI (thallium iodide). A specific example of a method for forming the scintillator 101 will be described below. A resistance heating boat is filled with the raw material of the scintillator as deposition material, and in addition, the scintillator supporting substrate 102 on which the supporting substrate protective layer 103 is formed is set on a support holder which rotates. Subsequently, the inside of the deposition apparatus is evacuated by a vacuum pump. Ar gas is introduced, and the degree of vacuum is adjusted to 0.1 Pa. Then, deposition is performed.

Figure 3B:
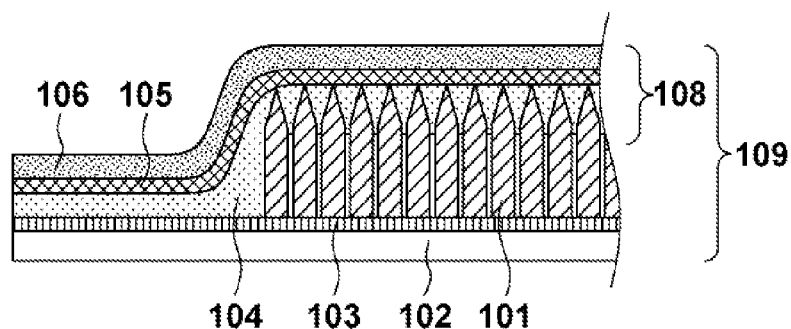

Next, as shown in FIG. 3B, the scintillator panel 109 is formed by thermocompression bonding the scintillator protective film 108 to the scintillator substrate 107 to cover the scintillator 101. As described above, the scintillator protective film 108 has the three-layer structure of the organic protective layer 104, the inorganic protective layer 105, and the organic protective layer 106. The thickness of the organic protective layer 104 is, for example, not less than 5 µm and not more than 50 µm. The thickness of the inorganic protective layer 105 is, for example, not less than 10 nm and not more than 100 nm. The thickness of the organic protective layer 106 is, for example, not less than 5 µm and not more than 50 µm. A method for forming the scintillator protective film 108 will be described below. First, the inorganic protective layer 105 is formed on the organic protective layer 104 such as an organic resin film by CVD, sputtering, or vacuum deposition. Specifically, M-5 manufactured by Kurabo Industries, Ltd., which is an olefin based hot melt resin of 30 µm thickness, for example, is used as the organic protective layer 104. $Al_2O_3$ of 100 nm thickness is formed as the inorganic protective layer 105, by sputtering it on the organic protective layer 104. Furthermore, the organic protective layer 106, which is the above-described M-5 manufactured by Kurabo Industries, Ltd., is bonded by thermocompression bonding, on the inorganic protective layer 105, using a vacuum laminator, while the organic protective layer 106 is heated to 100° C. and pressurized to 0.5 MPa, and thereby the scintillator protective film 108 is formed.

Next, the scintillator 101 is covered with the scintillator protective film 108. The scintillator protective film 108 is bonded by thermocompression bonding, to the scintillator substrate 107 by using a vacuum laminator or a heat roller. Thereby, the inorganic protective layer 105 and the scintillator 101 are bonded. For this bonding, for example, the vacuum laminator is used, and thereby thermocompression bonding is performed in the condition of a temperature of 100° C. and a pressure of 0.5 MPa. Under this condition, the organic protective layer 104 takes on a softened state, and the tips of the columnar crystals of the scintillator 101 enter the organic protective layer 104. On the other hand, under this condition, since the inorganic protective layer 105 does not take on a softened state, the tip of the columnar crystal entering the organic protective layer 104 does not enter the inorganic protective layer 105, and the tip of the columnar crystal reaches the inorganic protective layer 105 and stops.

Figure 3C:
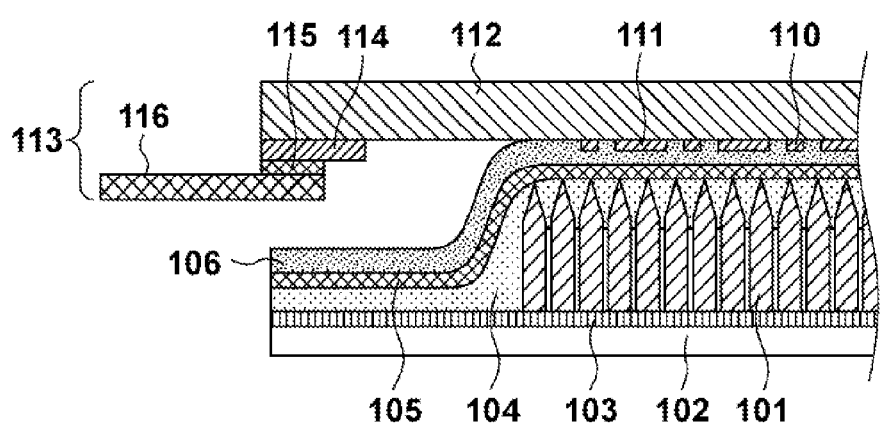

Next, as shown in FIG. 3C, the scintillator panel 109 and the sensor panel 113 are bonded with the organic protective layer 106. Thereby, the inorganic protective layer 105 and the sensor panel 113 are bonded. Since the sensor panel 113 may be prepared by a well-known method, its description is omitted. In the lamination of the scintillator panel 109 and the sensor panel 113, for example, a vacuum laminator is used, and thermocompression bonding is performed under the condition of a temperature of 100° C. and a pressure of 0.5 MPa. Under this condition, the organic protective layer 106 takes on a softened state, and the scintillator panel 109 and the sensor panel 113 are bonded. Along with this, the exposed part of the semiconductor members 110 and the electrically conductive members 111 of the sensor panel 113 enters the organic protective layer 106, and is covered with the organic protective layer 106. That is, the organic protective layer 106 may function as the surface protection layer for the sensor panel 113. In addition, under this condition, since the inorganic protective layer 105 does not take on a softened state, the semiconductor members 110 and electrically conductive members 111 do not penetrate the inorganic protective layer 105. Therefore, under this condition, the inorganic protective layer 105 is present between the semiconductor members 110 and the electrically conductive members 111, and the scintillator 101. Therefore, it is possible to prevent the damage and corrosion of the semiconductor members 110 and the electrically conductive members 111, due to the scintillator 101. Finally, the end parts of the sensor panel 113 and the scintillator panel 109 are bonded and sealed by using the sealing member 117, and thereby the radiation detection apparatus 100 as shown in FIGS. 1A and 1B is formed.

In the above-described example, M-5 of 30 μm thickness, manufactured by Kurabo Industries, Ltd., which is an olefin based hot melt resin, is used as the organic protective layer 104 and the organic protective layer 106. However, in order to make the protection layers even thinner, LNA-1007 manufactured by Toray Industries, Inc., which is a polyimide based hot melt resin of 7 μm thickness, may be used. Thereby, the distance between the scintillator 101 and the sensor panel 113 can be further reduced. Thus, a higher sharpness is obtained. When LNA-1007 is used, the above-described thermocompression bonding as described in FIGS. 3B and 3C is performed under the condition of a temperature of 120° C. and a pressure of 0.5 MPa. When the heat resistance of the sensor panel 113 is a problem, the cohesive agent having cohesiveness at room temperature may be used as the organic protective layer 106. Thereby, lamination can be performed at room temperature by using the laminator, and the productivity can be enhanced.

Next, with reference to FIGS. 4 through 11C, various modified examples of the radiation detection apparatus 100 will be described. In FIGS. 4 through 11C, components in common with those in FIGS. 1A and 1B are marked with identical reference numerals, and their duplicate description is omitted. In addition, the above-described modified example of the radiation detection apparatus 100 is similarly applicable to the radiation detection apparatuses described below. Subsequently, since the radiation detection apparatuses shown in FIGS. 4 through 6, and 9 are manufactured in a manner similar to the manufacturing method as described with reference to FIGS. 3A through 3C, only the differing process steps will be described.

Figure 4:
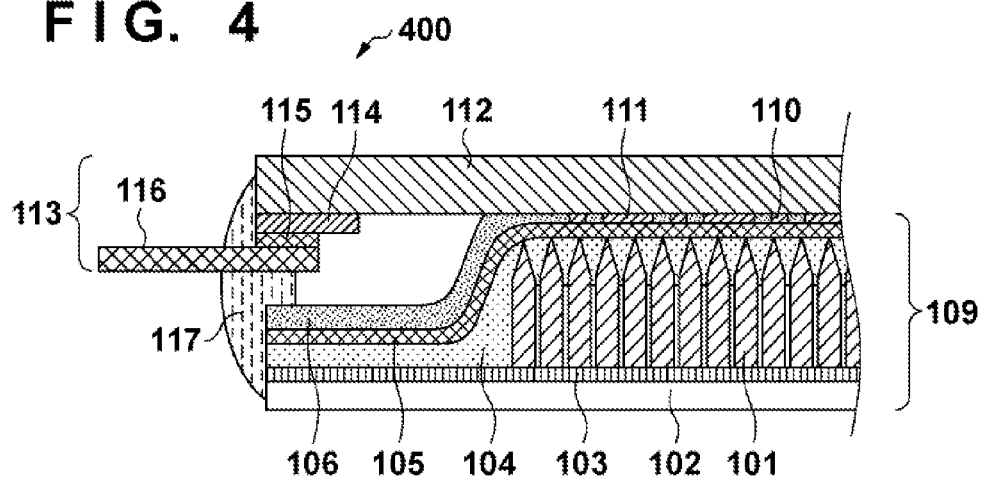
FIG. 4 is a diagram illustrating another illustrative structure of a radiation detection apparatus of an embodiment of the present invention.

In a radiation detection apparatus 400 as shown in FIG. 4, the semiconductor members 110 and the electrically conductive members 111 penetrate partially the organic protective layer 106, and are in contact with the inorganic protective layer 105. What is in contact with the inorganic protective layer 105 may be a part or all of the semiconductor members 110 and the electrically conductive members 111. Next, in the process as described with reference to FIG. 3C, the radiation detection apparatus 400 may be formed by thermocompression bonding, the scintillator panel 109 and the sensor panel 113, under the condition of a temperature of 100° C. and a pressure of 1 MPa. The radiation detection apparatus 400 can be made shorter, in the distance between the scintillator 101 and the sensor panel 113, than the radiation detection apparatus 100.

Figure 5:
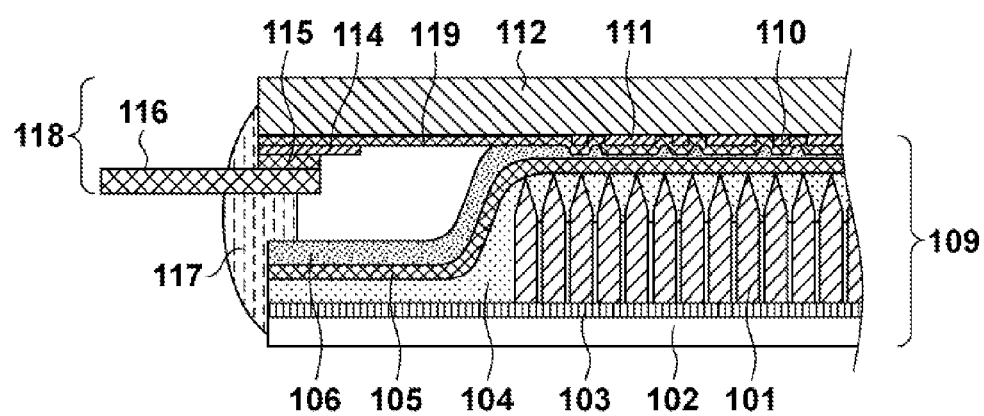
FIG. 5 is a diagram illustrating another illustrative structure of a radiation detection apparatus of an embodiment of the present invention.

A radiation detection apparatus 500 as shown in FIG. 5 includes a sensor panel 118 in place of the sensor panel 113. The sensor panel 118 may further include a sensor panel protective film 119 covering the semiconductor members 110 and the electrically conductive members 111. Thereby, the durability of the sensor panel 118 is enhanced. The radiation detection apparatus 500 has a part in which the sensor panel protective film 119 is in contact with the organic protective layer 106. The sensor panel protective film 119 may be formed by SiN, $TiO_2$, LiF, $Al_2O_3$, MgO, or the like, for example. The sensor panel protective film 119 may be formed by polyphenylene sulfide resin, fluorine resin, polyether ether ketone resin, liquid crystal polymer, polyether nitryl resin, polysulfone resin, polyether sulfone resin, polyallylate resin, polyamide-imide resin, polyetherimide resin, polyimid resin, epoxy based resin, silicone resin, or the like. The sensor panel 118 may be formed by depositing SiN on the sensor panel 113 by sputtering. The radiation detection apparatus 400 is superior in durability and reliability than the radiation detection apparatus 100.

Figure 6:
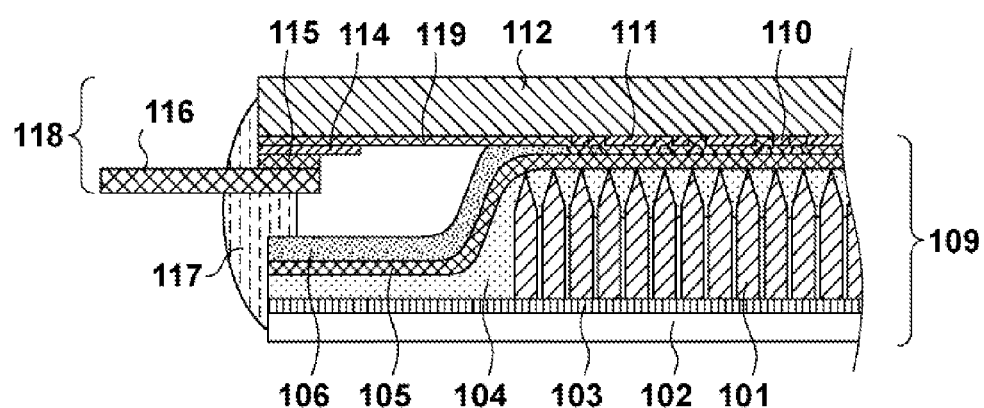
FIG. 6 is a diagram illustrating another illustrative structure of a radiation detection apparatus of an embodiment of the present invention.

Although a radiation detection apparatus 600 as shown in FIG. 6 is similar to the radiation detection apparatus 500, the part covering the semiconductor members 110 and the electrically conductive members 111, of the sensor panel protective film 119 penetrates the organic protective layer 106, and is in contact with the inorganic protective layer 105. The part that is in contact with the inorganic protective layer 105 may be a part or all of the part covering the semiconductor members 110 and the electrically conductive members 111. In the process described with reference to FIG. 3C, the radiation detection apparatus 600 may be formed by thermocompression bonding, the scintillator panel 109 and the sensor panel 113, under the condition of a temperature of 100° C. and a pressure of 1 MPa. In the radiation detection apparatus 600, the distance between the scintillator 101 and the sensor panel 113 can be made shorter than in the radiation detection apparatus 500.

Figure 7A:
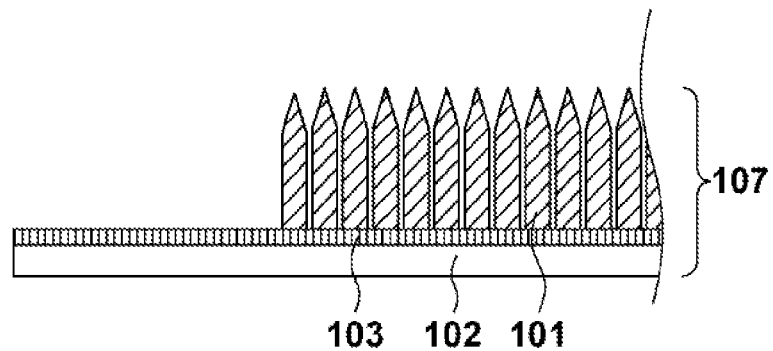
FIGS. 7A through 7C are diagrams illustrating another illustrative method for manufacturing a radiation detection apparatus of an embodiment of the present invention.

Subsequently, with reference to FIGS. 7A through 7C, another method for manufacturing the radiation detection apparatus 100 will be described. Unlike the manufacturing method described with reference to FIGS. 3A through 3C, in this manufacturing method, the organic protective layer 106 of the scintillator protective film 108 is formed on the scintillator substrate 107 in a process separate from the processes of the organic protective layer 104 and the inorganic protective layer 105. First, as shown in FIG. 7A, the scintillator substrate 107 is formed. Since this process is similar to the process as described with reference to FIG. 3A, its description will be omitted.

Figure 7B:
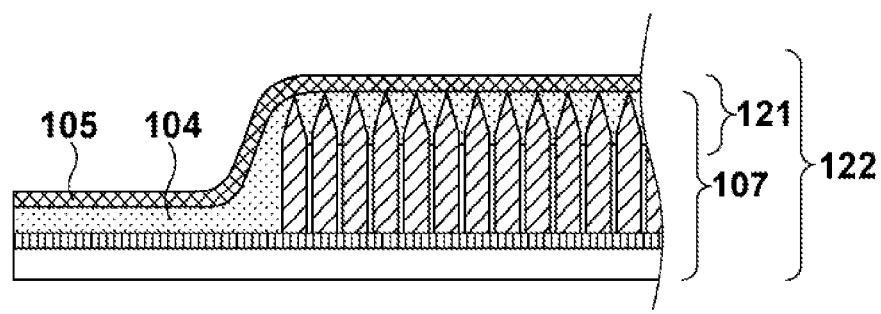

Subsequently, as shown in FIG. 7B, a scintillator panel 122 is formed by thermocompression bonding, a scintillator protective film 121 having a two-layer structure of the organic protective layer 104 and the inorganic protective layer 105, on the scintillator substrate 107 to cover the scintillator 101. First, before the lamination to the scintillator substrate 107, the scintillator protective film 121 is formed. For example, in the manufacturing method, LNA-1007 manufactured by Toray Industries, Inc., which is a polyimide based hot melt resin of 7 μm thickness may be used as the organic protective layer 104. In addition, $Al_2O_3$ of 100 nm thickness may be used as the inorganic protective layer 105. The scintillator protective film 121 may be formed by forming an $Al_2O_3$ film on the organic protective layer 104 by sputtering.

Next, the scintillator 101 is covered with the scintillator protective film 121. The scintillator protective film 121 is laminated by thermocompression bonding to the scintillator substrate 107. For example, a vacuum laminator is used, and thermocompression bonding may be performed under the condition of a temperature of 120° C. and a pressure of 0.5 MPa. Since the inorganic protective layer 105 does not heat-melt in this condition, as compared with the case where the scintillator protective film 108 of the three-layer structure is laminated to the scintillator substrate 107, it is possible to planarize the outer surface (the side opposite to the scintillator 101) of the scintillator protective film 121. As a result, while the sensor panel 113 and the scintillator panel 122 are laminated, it is possible to keep the required temperature and pressure low. Also in the manufacturing method of FIGS. 7A through 7C, under this condition, the organic protective layer 104 takes on a softened state, and the tips of the columnar crystals of the scintillator 101 penetrates the organic protective layer 104 and reaches the inorganic protective layer 105. On the other hand, under this condition, since the inorganic protective layer 105 does not take on a softened state, the tip of the columnar crystal does not enter the inorganic protective layer 105, and the tip of the columnar crystal contacts the inorganic protective layer 105 and stops. Although the scintillator protective film 108 of the two-layer structure is laminated to the scintillator substrate 107 in the above-described process, after the organic protective layer 104 is formed to the scintillator substrate 107, the inorganic protective layer 105 may be formed by using CVD or vacuum deposition.

Figure 7C:
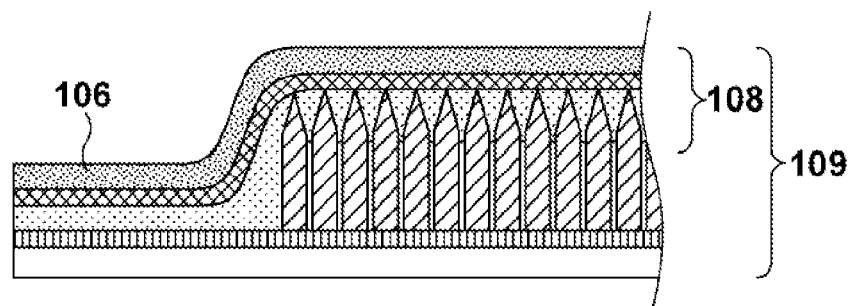

Subsequently, as shown in FIG. 7C, the scintillator panel 109 is formed by forming the organic protective layer 106 on the scintillator protective film 121, to the scintillator panel 122. Since the outer surface of the scintillator protective film 121 of the scintillator panel 122 is covered with the inorganic protective layer 105, the scintillator panel 122 does not have adhesiveness with the sensor panel 113. Therefore, the organic protective layer 106 is formed on the scintillator panel 122. For example, in the manufacturing method of FIGS. 7A through 7C, M-5 manufactured by Kurabo Industries, Ltd., which is an olefin based hot melt resin of 30 μm thickness, may be used as the organic protective layer 106. A vacuum laminator is used, and thermocompression bonding is performed under the condition of a temperature of 100° C. and a pressure of 0.5 MPa. Then, the organic protective layer 106 is laminated onto the scintillator panel 122. Subsequently, the scintillator panel 109 and the sensor panel 113 are laminated in the condition of a temperature of 90° C. and a pressure of 0.4 MPa. The temperature in this condition is lower than the temperature in the manufacturing method of FIGS. 3A through 3C. Therefore, the manufacturing method of FIGS. 7A through 7C may be particularly effective in the case where the heat resistance of the sensor panel 113 is low. Since the following processes are similar to the process as described with reference to FIGS. 3A through 3C, their description will be omitted.

Figure 8A:
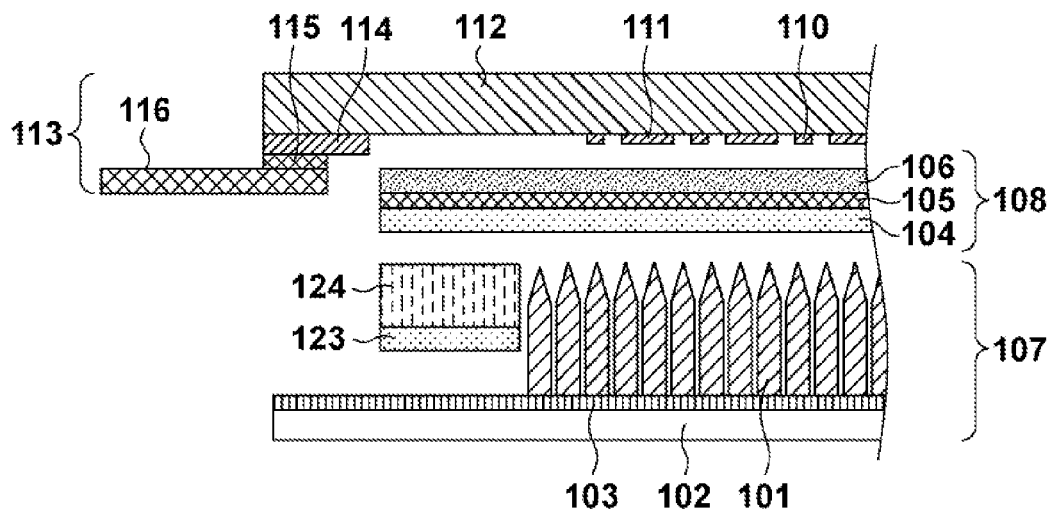
FIGS. 8A and 8B are diagrams illustrating another illustrative method for manufacturing a radiation detection apparatus of an embodiment of the present invention.
Figure 8B:
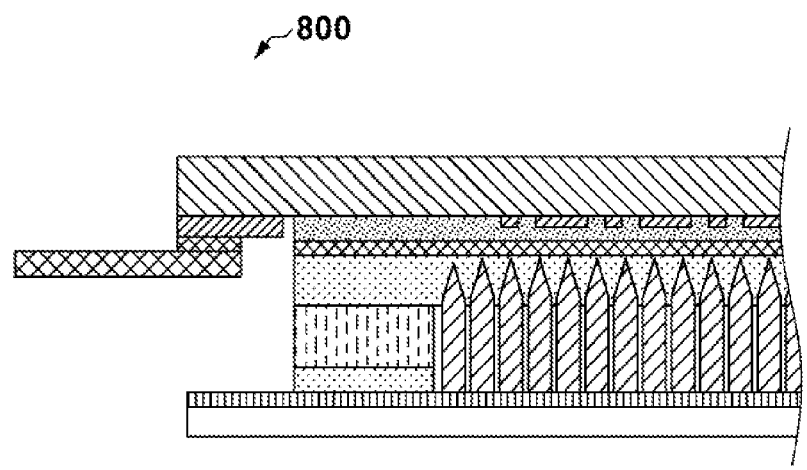

Next, with reference to FIGS. 8A and 8B, a further method for manufacturing the radiation detection apparatus 100 will be described. Unlike the manufacturing method described with reference to FIGS. 3A through 3C, the sensor panel 113, the scintillator substrate 107, and the scintillator protective film 108 are collectively bonded by thermocompression bonding. First, a sealing member 124 is disposed around the scintillator 101, above the supporting substrate protective layer. On the surface where the sealing member 124 is bonded to the scintillator substrate 107, an organic member 123 that is a hot melt resin, for example, is formed. Then, as shown in FIG. 8A, the scintillator protective film 108 is disposed at a position covering the scintillator 101 and the sealing member 124, and the sensor panel 113 is disposed thereon. In the state, these are introduced into the vacuum laminator, and thermocompression bonding is performed under the condition of a temperature of 100° C. and a pressure of 0.5 MPa. Thereby, a radiation detection apparatus 800 as shown in FIG. 8B can be formed. In the manufacturing method of FIGS. 8A and 8B, as compared with the manufacturing method of FIGS. 3A through 3C, and 7A through 7C, it is possible to manufacture the radiation detection apparatus 800 in a short time, and a high productivity is achieved.

Figure 9:
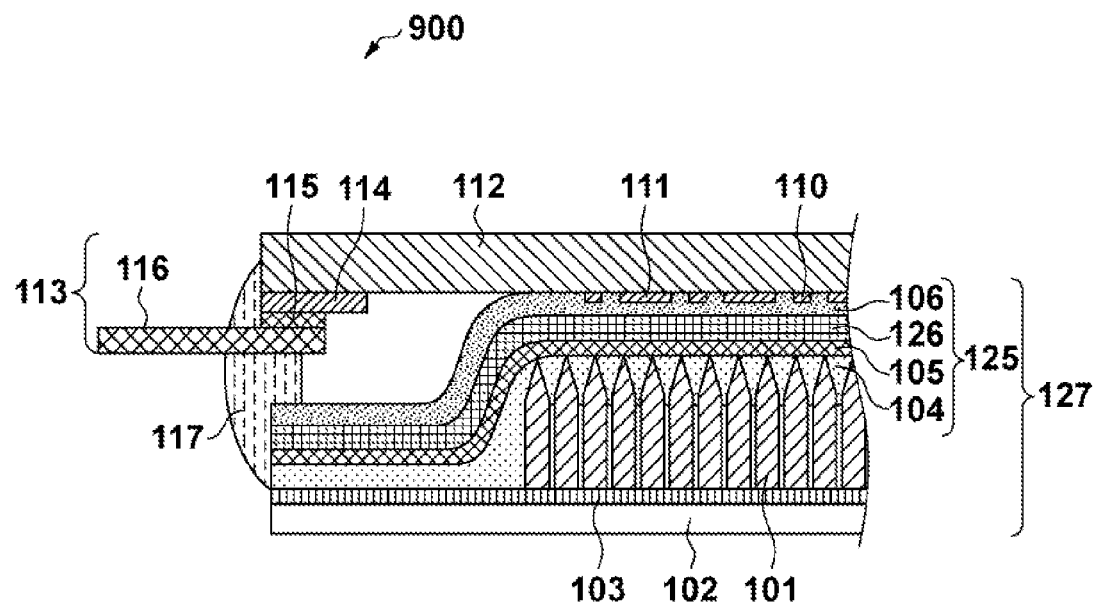
FIG. 9 is a diagram illustrating another illustrative structure of a radiation detection apparatus of an embodiment of the present invention.

A radiation detection apparatus 900 as shown in FIG. 9 includes a scintillator protective film 125 in place of the scintillator protective film 108. The scintillator protective film 125 is a film in which an inorganic layer base 126 is further disposed between the inorganic protective layer 105 and the organic protective layer 106 of the scintillator protective film 108.

The scintillator protective film 125 can be manufactured as described below. First, an $SiO_2$ film of 50 nm thickness is formed, as the inorganic protective layer 105, on one surface of the inorganic layer base 126 made of PET resin of 2 μm thickness. Subsequently, the inorganic protective layer 105 is coated with a thermoplastic resin made of polyimide-epoxy resin of 7 μm thickness, and thereby the organic protective layer 104 is formed. Subsequently, the other surface of the inorganic layer base 126 is coated with a cohesive agent of 4 μm thickness, and thereby the coating of the organic protective layer 106 is formed. In this manner, by using a PET resin as the inorganic layer base 126, the inorganic layer base 126 may serve as a coating core material for the hot melt resin and the cohesive agent. In this manner, as compared with the scintillator protective film 108 that does not have a core material, it is possible to coat the hot melt resin and the cohesive agent thinly, and the thickness of the scintillator protective film 125 can be reduced. In the example of the present embodiment, the thickness of the scintillator protective film 125 is 13 μm.

In a manner similar to FIG. 3B, the scintillator 101 is covered with the scintillator protective film 125 thus formed. Then, the scintillator protective film 125 is bonded by thermocompression bonding, to the scintillator substrate 107 by using the vacuum laminator. Thereby, a scintillator panel 127 is formed. Then, the scintillator panel 127 and the sensor panel 118 are pressurized and laminated by using a roll laminator.

Figure 10:
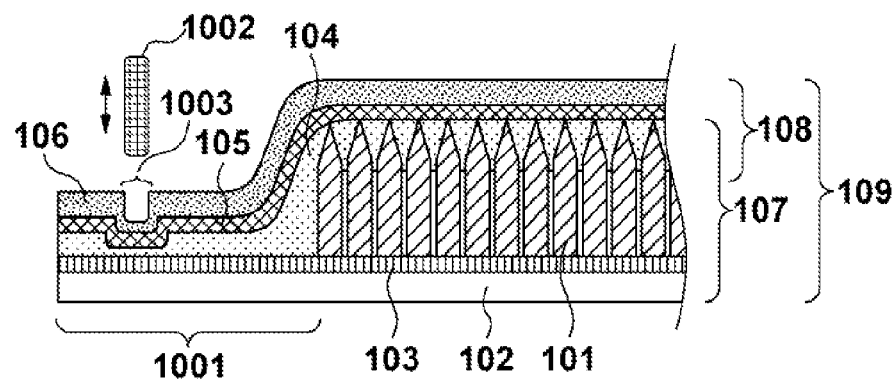
FIG. 10 is a diagram illustrating another illustrative structure of a scintillator panel of an embodiment of the present invention.

Subsequently, with reference to FIG. 10, a method for manufacturing a more moisture-resistant scintillator panel will be described. Although the scintillator panels in the embodiments described above also have sufficient moisture-resistance, the scintillator panel of the present embodiment has an even higher moisture-resistance.

First, the scintillator panel 109 shown in FIG. 1B, is prepared. An end part 1001 (part where the scintillator protective film 108 and the supporting substrate protective layer 103 are in contact with each other) of this scintillator panel 109 is pressurized for 1 minute, by using a heat sealing head 1002 of 2 mm width, heated to 170° C. Then heat sealing is performed. Thereby, a scintillator panel having a heat sealing part 1003 as shown in FIG. 10 is formed. The first organic protective layer 104 made of hot melt resin is bonded by compression bonding to the supporting substrate protective layer 103, by the heat sealing part 1003. Thereby the leakage path becomes narrower, and a more moisture-resistant scintillator panel is obtained. Although the scintillator panel 109 is used as an example in FIG. 10, any of the above-described scintillator panel modifications may be used.

Figure 11A:
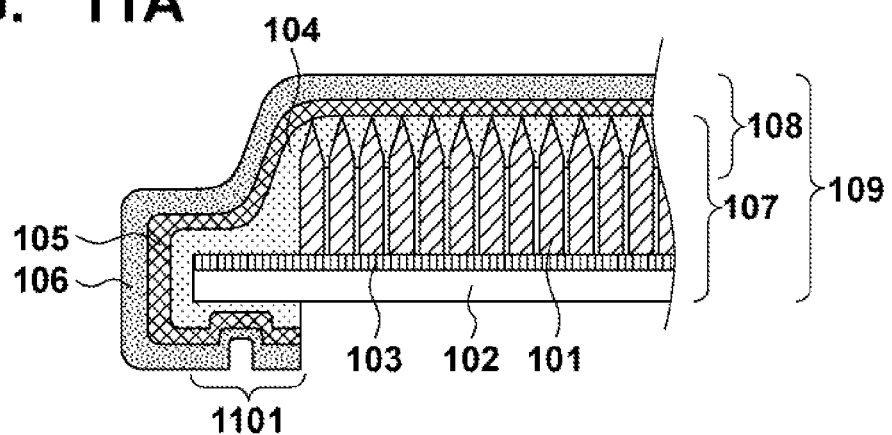
FIGS. 11A through 11C are diagrams illustrating other illustrative structures of a scintillator panel of an embodiment of the present invention.
Figure 11B:
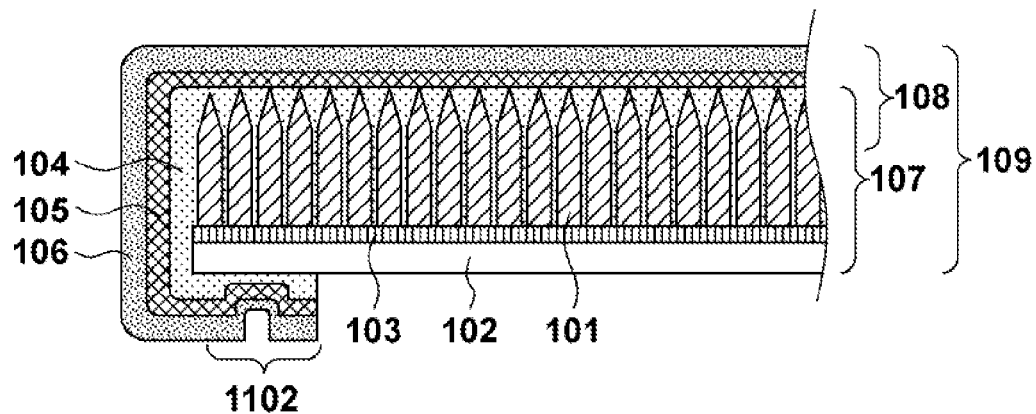
Figure 11C:
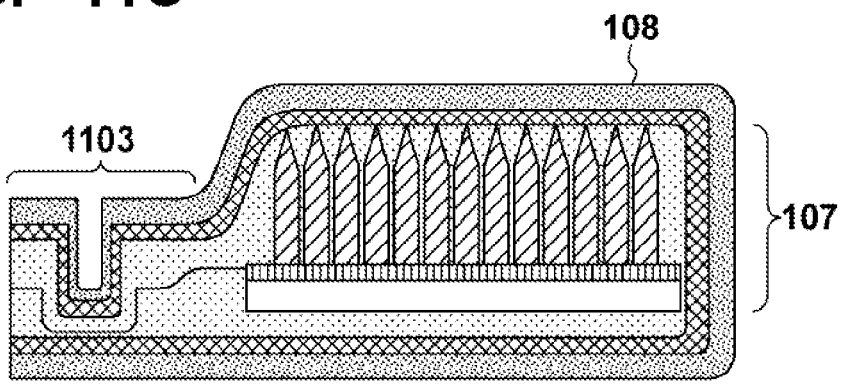

In addition, in recent years, with the increase in size and decrease in weight of radiation detection apparatuses, the bezel of the substrate end part is narrowed. For example, there is the case where the end part of the scintillator 101 and the end part of the scintillator supporting substrate 102 are in close proximity to each other, as shown in FIG. 11A, or the case where the scintillator 101 is deposited to the end part of the scintillator supporting substrate 102, as shown in FIG. 11B. In these cases, as shown in FIGS. 11A and 11B, by thermocompression bonding the scintillator protective films 108 to the back sides of the scintillator supporting substrates 102, heat sealing may be performed in the parts 1101 and 1102 of these back sides. In addition, as shown in FIG. 11C, the scintillator substrate 107 may be entirely covered with the scintillator protective film 108. Then, one scintillator protective film 108 may be heat-sealed to the other scintillator protective film 108, in the part 1103 in which the scintillator protective film 108 overlaps.

In the radiation detection apparatuses described above, since the scintillator 101 is covered with the inorganic protective layer 105, the moisture-resistance of the scintillator 101 is enhanced. For example, in the scintillator panel 109, under a CR environment (at 25° C. and at 40%), the degradation of MTF can be suppressed to 5% or below in 30 days. When the scintillator panel 109 is stored in an $N_2$ desiccator or a vacuum desiccator, it is possible to further suppress the degradation of MTF. In addition, since the scintillator 101 entering the scintillator protective film 108 during the thermocompression bonding of the scintillator protective film 108 is stopped by the inorganic protective layer 105, the distance between the scintillator 101 and the sensor panel 113 can be made shorter. In addition, since cohesive agent is not used for the bonding of the sensor panel 113 and the scintillator 101, it is possible to achieve a reduction in the amount of work, and a cost reduction as compared with the case where the cohesive agent is used. In particular, since the scintillator protective film 108 functions also as sensor panel protective film in each radiation detection apparatus of FIGS. 1A, 1B, and 4, the distance between the sensor panel 113 and the scintillator 101 can be made even shorter, and in addition, the amount of work can also be reduced.

Other Embodiments

Figure 12:
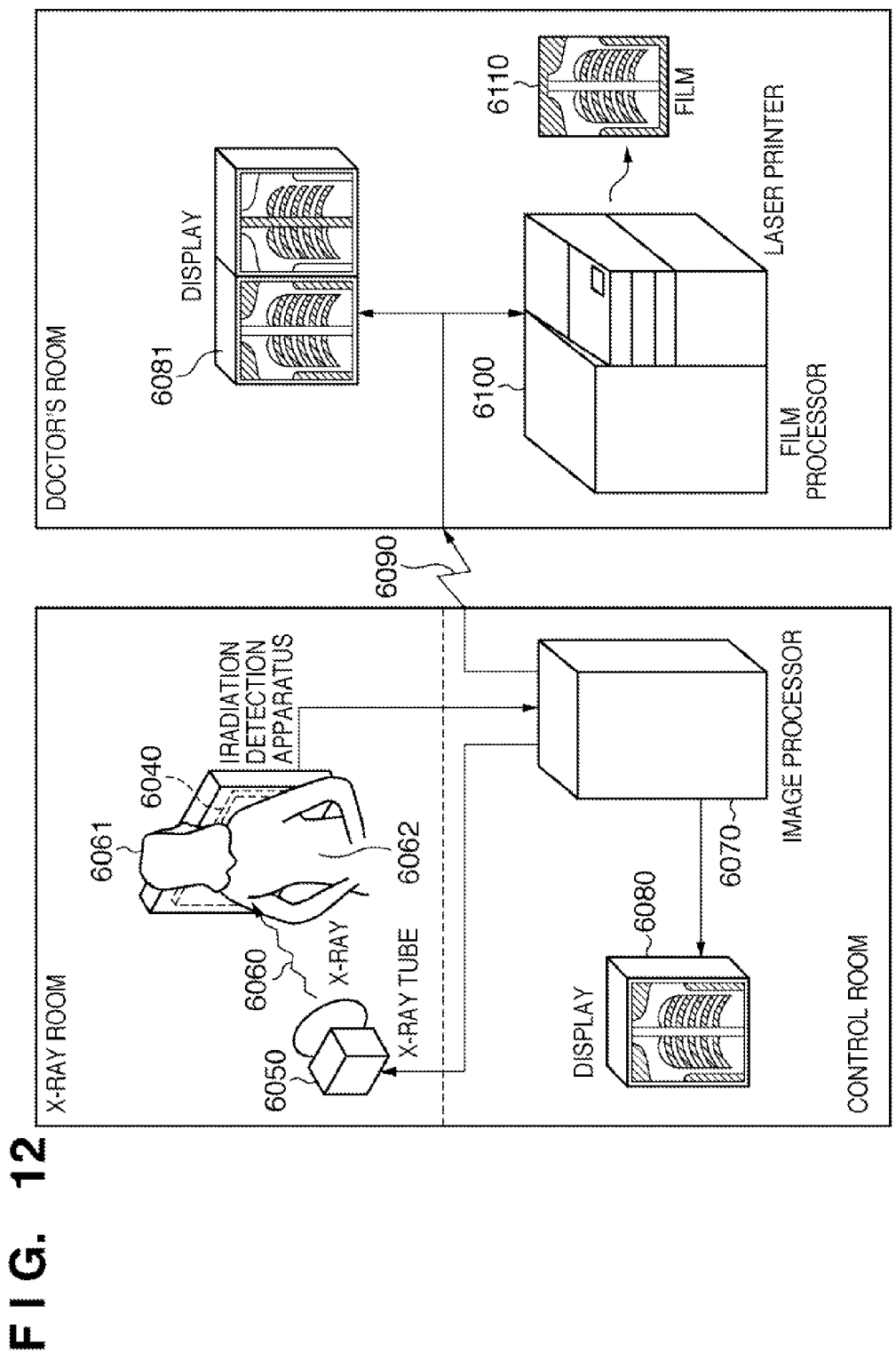
FIG. 12 is a diagram illustrating an illustrative structure of a radiation detection system according to an embodiment of the present invention.

FIG. 12 is a view showing an application example of a radiation detection apparatus according to the present invention, to an X-ray diagnosis system (radiation detection system). X-rays 6060 serving as radiation, generated in an X-ray tube 6050 (radiation source) pass through the breast 6062 of a subject or patient 6061, and enter a detection apparatus 6040 of the present invention. Information on the inside of the body of the patient 6061 is included in these incident X-rays. A scintillator emits light in response to the incidence of the X ray. This light is photoelectrically converted, and electrical information is obtained. This information is converted into a digital signal, and is image-processed by an image processor 6070 that serves as a signal processing unit. Then, it is possible to view the information on a display 6080 that serves as a display unit, in the control room. Also, the radiation detection system includes at least the detection apparatus, and the signal processing unit for processing the signal from the detection apparatus.

In addition, this information can be transferred to a remote location by a transmission processing unit such as a telephone line 6090. This information can be displayed on a display 6081 that serves as a display unit, or saved in a recording unit such as an optical disk, in a doctor room or the like in another place. A doctor at the remote location can diagnose. In addition, it is possible to record the information in a film 6110 that serves as a recording media, by a film processor 6100 that serves as the recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-044298, filed Mar. 1, 2011, which is hereby incorporated by reference herein in its entirety.

What is claimed is:

1. A radiation detection apparatus comprising a sensor panel and a scintillator panel, the scintillator panel including:
   a substrate;
   a scintillator disposed on the substrate; and
   a scintillator protective film that has a first organic protective layer and an inorganic protective layer, and covers the scintillator, wherein
the scintillator protective film is located between the sensor panel and the scintillator,
   the first organic protective layer is located on a scintillator side from the inorganic protective layer, and
   a surface on a sensor panel side of the scintillator is partially in contact with the inorganic protective layer.

2. The apparatus according to claim 1, wherein the scintillator comprises a set of columnar crystals, and tips of the columnar crystals penetrate the first organic protective layer and are in contact with the inorganic protective layer.

3. The apparatus according to claim 1, wherein the scintillator protective film further comprises a second organic protective layer,
   the second organic protective layer is located on the sensor panel side from the inorganic protective layer,
   the inorganic protective layer and the scintillator are bonded by the first organic protective layer, and
   the inorganic protective layer and the sensor panel are bonded by the second organic protective layer.

4. The apparatus according to claim 3, wherein
   the sensor panel comprises semiconductor members and electrically conductive members forming a pixel array, and
   at least some of the semiconductor members and at least some of the electrically conductive members have a part that is in contact with the second organic protective layer.

5. The apparatus according to claim 4, wherein at least some of the semiconductor members and at least some of the electrically conductive members have a part that penetrates the second organic protective layer and is in contact with the inorganic protective layer.

6. The apparatus according to claim 3, wherein the sensor panel comprises semiconductor members and electrically conductive members forming a pixel array, and a sensor panel protective film covering the semiconductor members and the electrically conductive members, and
   the sensor panel protective film has a part that is in contact with the second organic protective layer.

7. The apparatus according to claim 6, wherein a part of the sensor panel protective film that covers the semiconductor members and the electrically conductive members includes a part that penetrates the second organic protective layer and is in contact with the inorganic protective layer.

8. The apparatus according to claim 3, wherein a temperature for bringing the first organic protective layer into a softened state and a temperature for bringing the second organic protective layer into a softened state both are lower than a temperature for bringing the inorganic protective layer into a softened state.

9. The apparatus according to claim 3, wherein the first organic protective layer and the second organic protective layer are organic resin films, and the inorganic protective layer is an oxide film or a nitride film.

10. A radiation detection system comprising:
the radiation detection apparatus according to claim 1; and
a signal processing unit for processing a signal obtained by the radiation detection apparatus.

11. A scintillator panel comprising
a substrate;
a scintillator disposed on the substrate; and
a scintillator protective film that has an organic protective layer and an inorganic protective layer, and covers the scintillator, wherein
the organic protective layer is located on a scintillator side from the inorganic protective layer, and
a surface on an opposite side to a surface on a substrate side, of the scintillator is partially in contact with the inorganic protective layer.

12. A method for manufacturing a radiation detection apparatus, comprising:
forming a scintillator on a substrate;
preparing a scintillator protective film having an organic protective layer and an inorganic protective layer;
covering the scintillator with the scintillator protective film so that the organic protective layer is in contact with the scintillator;
bonding, by thermocompression bonding, the scintillator protective film to the scintillator; and
laminating the scintillator covered with the scintillator protective film and a sensor panel,
wherein in the laminating, a surface on an opposite side to a surface on a substrate side, of the scintillator that enters partially the organic protective layer reaches the inorganic protective layer and stops.

13. A method for manufacturing a scintillator panel comprising:
forming a scintillator on a substrate;
preparing a scintillator protective film having an organic protective layer and an inorganic protective layer;
covering the scintillator with the scintillator protective film so that the organic protective layer is in contact with the scintillator; and
bonding, by thermocompression bonding, the scintillator protective film to the scintillator,
wherein in the bonding by thermocompression bonding, a surface on a side opposite to a surface on a substrate side, of the scintillator that enters partially the organic protective layer reaches the inorganic protective layer and stops.

14. A method for manufacturing a scintillator panel comprising:
preparing a scintillator protective film having an organic protective layer and an inorganic protective layer; and
covering a scintillator formed on a substrate with the scintillator protective film so that the organic protective layer is in contact with the scintillator.

15. The method according to claim 14, further comprising:
bonding, by thermocompression bonding, the scintillator protective film to the scintillator,
wherein in the bonding by thermocompression bonding, a surface on a side opposite to a surface on a substrate side, of the scintillator that enters partially the organic protective layer reaches the inorganic protective layer and stops.

16. The method according to claim 15, wherein the scintillator comprises a set of columnar crystals, and tips of the columnar crystals penetrate the first organic protective layer and are in contact with the inorganic protective layer.

17. The method according to claim 15, wherein
the scintillator protective film further comprises a second organic protective layer,
the second organic protective layer is located on the inorganic protective layer, and
the inorganic protective layer and the scintillator are bonded by the first organic protective layer.

18. The method according to claim 15, wherein the first organic protective layer and the second organic protective layer are organic resin films, and the inorganic protective layer is an oxide film or a nitride film.

* * * * *